US011183658B2

(12) United States Patent
Wang

(10) Patent No.: US 11,183,658 B2
(45) Date of Patent: Nov. 23, 2021

(54) METHOD OF MANUFACTURING AN ORGANIC LIGHT EMITTING DIODE (OLED) SUBSTRATE AND OLED SUBSTRATE

(71) Applicant: WUHAN CHINA STAR OPTOELECTRONICS TECHNOLOGY CO., LTD., Hubei (CN)

(72) Inventor: Lijun Wang, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 490 days.

(21) Appl. No.: 16/308,897

(22) PCT Filed: Nov. 1, 2018

(86) PCT No.: PCT/CN2018/113261
§ 371 (c)(1),
(2) Date: Dec. 11, 2018

(87) PCT Pub. No.: WO2020/037825
PCT Pub. Date: Feb. 27, 2020

(65) Prior Publication Data
US 2021/0226148 A1 Jul. 22, 2021

(30) Foreign Application Priority Data
Aug. 22, 2018 (CN) .......................... 201810961352.1

(51) Int. Cl.
*H01L 51/52* (2006.01)
*H01L 27/32* (2006.01)
(Continued)

(52) U.S. Cl.
CPC .......... *H01L 51/52* (2013.01); *H01L 27/323* (2013.01); *H01L 27/326* (2013.01);
(Continued)

(58) Field of Classification Search
CPC .............. H01L 27/326; H01L 27/3244; H01L 51/5262; H01L 51/5253; H01L 51/50
See application file for complete search history.

(56) References Cited

U.S. PATENT DOCUMENTS 8,519,385 B2 * 8/2013 Lim .................... H01L 27/3258
257/40
10,454,051 B2 * 10/2019 Heo .................... H01L 51/5209
(Continued)

FOREIGN PATENT DOCUMENTS

| CN | 105226080 A | 1/2016 |
| CN | 106024807 A | 10/2016 |
| CN | 208538919 U | 2/2019 |

*Primary Examiner* — Victoria K. Hall

(57) ABSTRACT

A method of manufacturing an organic light emitting diode (OLED) substrate and an OLED substrate includes covering a top surface of the OLED substrate with a slope material layer, then adding an additive to the slope material layer, wherein ratios of the additive added in the slope material layer on surfaces of different regions of the OLED substrate are different, and finally curing the slope material layer until the slope material layer is stably solidified and forming a slope structure on the top surface of the OLED substrate. A top surface area of the OLED substrate formed by the slope material layer is greater than a top surface area of an original OLED substrate.

5 Claims, 2 Drawing Sheets

(51) Int. Cl.
   *H01L 51/56* (2006.01)
   *H01L 51/50* (2006.01)
(52) U.S. Cl.
   CPC ...... *H01L 27/3244* (2013.01); *H01L 51/5253* (2013.01); *H01L 51/5262* (2013.01); *H01L 51/56* (2013.01); *H01L 51/50* (2013.01)

(56) References Cited

U.S. PATENT DOCUMENTS

| | | | |
|---|---|---|---|
| 10,741,614 B2 * | 8/2020 | Son | H01L 51/5262 |
| 10,840,469 B2 * | 11/2020 | Hamada | H01L 27/3246 |
| 10,886,481 B2 * | 1/2021 | Fan | H01L 51/5012 |
| 2008/0316566 A1 | 12/2008 | Lan | |
| 2010/0109511 A1 * | 5/2010 | Kim | H01L 27/3258 |
| | | | 313/504 |
| 2011/0297943 A1 * | 12/2011 | Kim | H01L 27/3258 |
| | | | 257/59 |
| 2015/0001477 A1 * | 1/2015 | Namkung | H01L 27/3258 |
| | | | 257/40 |
| 2015/0236076 A1 * | 8/2015 | Sim | H01L 27/3218 |
| | | | 257/40 |
| 2016/0226013 A1 * | 8/2016 | Liu | H01L 27/3218 |
| 2017/0141163 A1 * | 5/2017 | Xiong | H01L 51/5225 |
| 2017/0287997 A1 * | 10/2017 | Park | H01L 27/3258 |
| 2018/0108715 A1 * | 4/2018 | Sasabayashi | H01L 27/3237 |
| 2018/0190923 A1 * | 7/2018 | Heo | H01L 51/5253 |
| 2018/0301516 A1 * | 10/2018 | Huang | G06F 3/0446 |
| 2019/0237526 A1 * | 8/2019 | Kim | H01L 33/387 |
| 2019/0341430 A1 * | 11/2019 | Lee | H01L 51/5225 |

\* cited by examiner

METHOD OF MANUFACTURING AN ORGANIC LIGHT EMITTING DIODE (OLED) SUBSTRATE AND OLED SUBSTRATE

FIELD OF INVENTION

The present disclosure relates to the field of display technologies, and more particularly to a method of manufacturing an organic light emitting diode (OLED) substrate and an OLED substrate.

BACKGROUND OF INVENTION

With continuous development of virtual reality (VR) technologies and mobile devices, resolution of display screens (that is, pixels per inch, PPI) is also constantly increasing. The higher the PPI value, the higher the pixel resolution, which means that the display screens can display images at a higher density. It is understood that, the higher the density of the images, the higher the fidelity of the images, the richer and more detailed the images, and the better the user experience. Current organic light emitting diode (OLED) technologies can be used for screens of VR devices. PPIs can be achieved at around 600. After amplifying the PPIs in the VR devices, projected pixels have large graininess and poor image quality. To produce such high PPI display screens, there are higher requirements for current manufacturing technologies and processing equipment. However, due to technical development of current manufacturing machines, materials, required chips, and testing equipment, there are still many technical bottlenecks, so that yield of current products has been very low, and the production cost is high, which cannot meet market demands and cannot promote high PPI display devices to a market very well.

Therefore, bottlenecks of current production equipment and technologies limit production of high pixel resolution products, which makes products costly, and therefore requires further improvement.

Therefore, bottlenecks of currently production equipments and technologies limit production of high pixel resolution products, which makes products costly, and therefore requires further improvement.

SUMMARY OF INVENTION

The present disclosure provides an organic light emitting diode (OLEO) substrate and an OLEO substrate, which can solve issues of high performance production equipment and high manufacturing cost required for manufacturing high pixel resolution products in the prior art, and low yield of production products.

In order to solve the above technical problems, a technical solution of the present disclosure is as follows.

According to an embodiment of the present disclosure, a method of manufacturing an organic light emitting diode (OLED) substrate is provided. The method includes:

first, covering a top surface of the OLED substrate with a slope material layer, then, adding an additive to the slope material layer, wherein ratios of the additive added in the slope material layer on surfaces of different regions of the OLED substrate are different, and finally, curing the slope material layer until the slope material layer is stably solidified and forming a slope structure on the top surface of the OLED substrate.

In an embodiment of the present disclosure, the method of curing the slope material layer includes baking or light irradiation.

According to an embodiment of the present disclosure, an OLED substrate is provided. The OLED substrate includes a slope material layer covering a top surface of the OLED substrate and an additive. Ratios of the additive added in the slope material layer on surfaces of different regions of the OLED substrate are different. After the slope material layer is cured, the slope material layer forms a slope structure on the OLED substrate, and the top surface of the slope material layer is provided with optical components or electronic components capable of presenting images.

In an embodiment of the present disclosure, an angle between a top surface of the slope material layer and the top surface of the OLED substrate ranges between 0 and 90 degrees.

In an embodiment of the present disclosure, the images presented by the optical components or the electronic components disposed on the top surface of the slope material layer are all projected within the top surface of the OLED substrate.

In an embodiment of the present disclosure, a top surface area of the slope material layer is greater than a top surface area of the OLED substrate.

In an embodiment of the present disclosure, a shortest distance from a highest end of the top surface of the slope material layer to the top surface of the OLED substrate ranges between 100 μm and 200 μm.

In an embodiment of the present disclosure, the optical components or the electronic components of the top surface of the slope material layer comprise thin film transistors, capacitors, and wires.

In an embodiment of the present disclosure, the slope material layer is a molecular structure having a main chain of C—C or C—Si material.

In an embodiment of the present disclosure, the OLED substrate is a touch substrate.

In an embodiment of the present disclosure, the OLED substrate is a display substrate.

In summary, beneficial effects of the embodiment of the present disclosure are as follows. The top surface of the substrate is covered with the slope material layer. Ratios of the additive added in the slope material layer on surfaces of different regions of the OLED substrate are different. After a heat treatment, the top surface of the substrate has the slope structure due to different ratios of the additive in each region. Other components of the display are then arranged on the slope material layer. High resolution screens produced by the process can be easily implemented under current equipment and technical conditions and have good production yields. Issues of increasing the pixel resolution of the screen under the conditions of the prior art are solved, and the production cost of the high resolution screens is reduced.

DESCRIPTION OF DRAWINGS

The accompanying figures to be used in description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
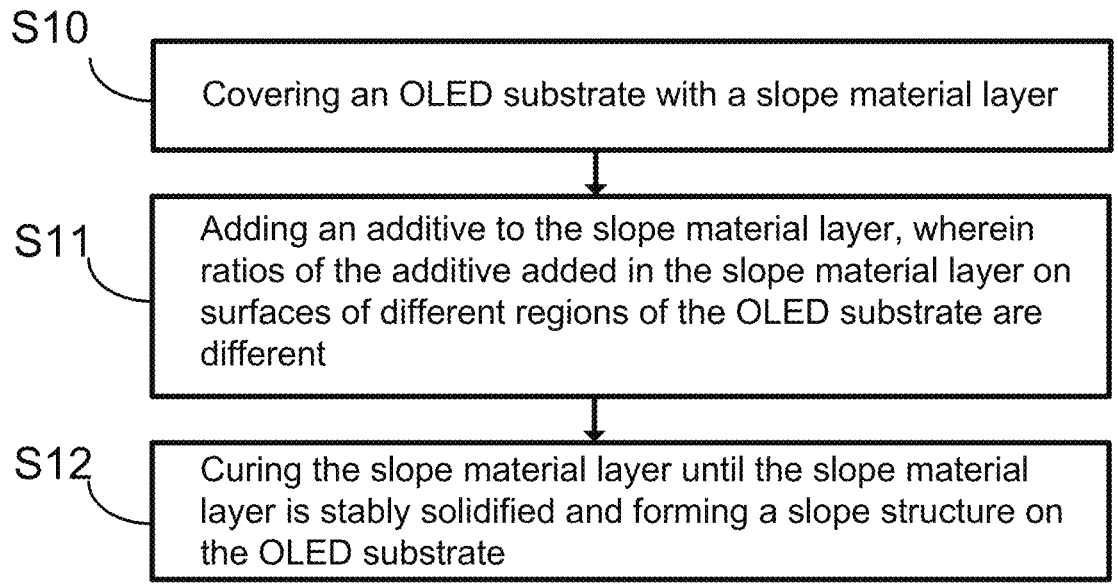
FIG. 1 is a flowchart of a method of manufacturing an organic light emitting diode (OLED) substrate according to an embodiment of the present disclosure.

Technical solutions in the embodiments of the present disclosure will be clearly and completely described in the following with reference to the accompanying drawings in the embodiments. It is apparent that the described embodiments are only a part of the embodiments of the present disclosure, and not all of the embodiments. All other embodiments obtained by those skilled in the art based on the embodiments of the present disclosure without making any inventive efforts are within the scope of the present disclosure.

The embodiments described herein with reference to the accompanying drawings are explanatory, illustrative, and used to generally understand the present disclosure. Furthermore, directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

Referring to FIG. 1, a detailed method of manufacturing an organic light emitting diode (OLED) substrate of the present disclosure includes following steps.

Step S10 of covering a top surface of the OLED substrate with a slope material layer is provided.

Step S11 of adding an additive to the slope material layer, wherein ratios of the additive added in the slope material layer on surfaces of different regions of the OLED substrate are different is provided.

Step S12 of curing the slope material layer until the slope material layer is stably solidified and forming a slope structure on the top surface of the OLED substrate is provided.

In practice, the curing process of the slope material layer may be a baking process or a light irradiation process, and the process is to enable the slope material layer covering the OLED substrate to be stabilized on the OLED substrate, and such that the slope material layer can form a slope structure on the OLED substrate.

Figure 2:
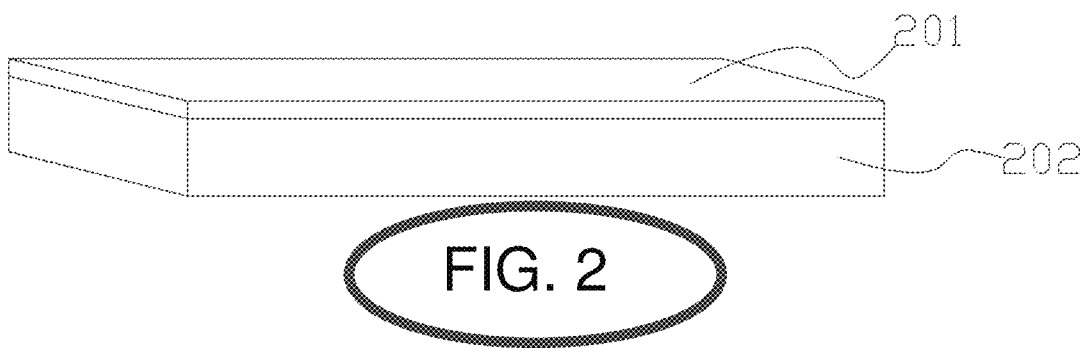
FIG. 2 is a schematic view illustrating a state in which a slope material layer on a top surface of an OLED substrate has not been cured according to an embodiment of the present disclosure.

Refer to FIG. 2, a schematic view illustrating a state in which a slope material layer on a top surface of an OLED substrate has not been cured according to an embodiment of the present disclosure is provided. A slope material layer 201 is formed after slope material covering a top surface of an OLED substrate 202. The slope material has stable chemical properties, high temperature resistance, and high insulation. The slope material may be a molecular structure having a main chain of C—C or C—Si material. An additive is required to add in the slope material layer 201. The slope material on a surface of each region of the OLED substrate 202 is added with different additive ratios, so that the slope material can be stably disposed on the top surface of the OLED substrate 202 after being cured, and a slope structure can be formed on the OLED substrate 202.

Figure 3:
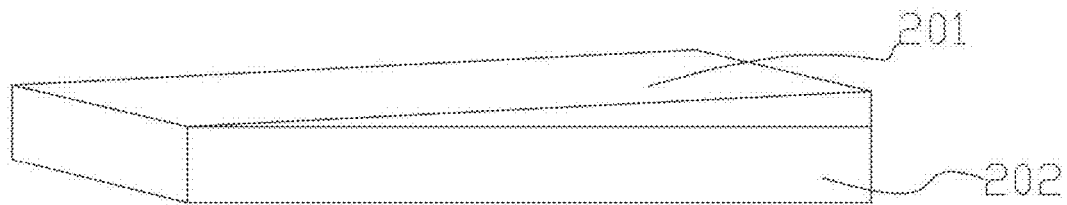
FIG. 3 is a schematic view of a slope material layer on a top surface of an OLED substrate after a curing process is completed according to an embodiment of the present disclosure.

Refer to FIG. 3, a schematic view of a slope material layer on a top surface of an OLED substrate after a curing process is completed according to an embodiment of the present disclosure is provided. Due to different additive ratios, after the curing treatment, deformation and thickness of the slope material layer 201 on the surface of each region of the OLED substrate 202 are different. Therefore, when slope material covering the OLED substrate 202 is formed stably, a slope structure at a certain angle is formed. The curing treatment of the slope material layer 201 may be a treatment process such as baking or light irradiation.

Figure 4:
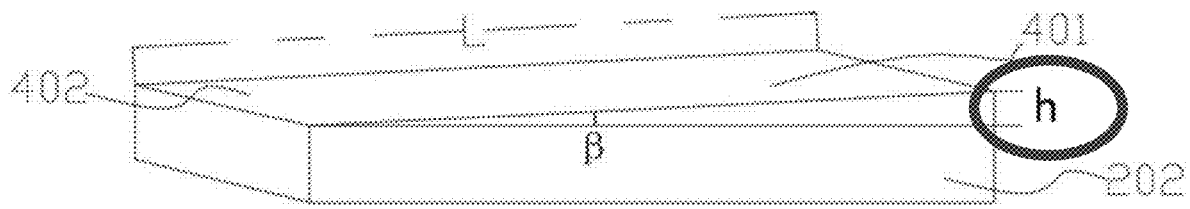
FIG. 4 is a schematic view of an OLED substrate according to an embodiment of the present disclosure.

Referring to FIG. 4, a top surface 401 of the slope material layer 201 forms an angle β with a top surface 402 of the OLED substrate 202, and the angle β ranges between 0 and 90 degrees, such that images presented by the optical components on the slope material layer 201 may all be projected onto the top surface 402 of the OLED substrate 202. A shortest distance h from a highest end of the top surface 401 of the slope material layer 201 to the top surface 402 of the OLED substrate 202 ranges between 100 μm and 200 μm. A slope side length of the slope material layer 201 is L. It can be understood from projection principle that if a length of the image presented by the optical component on the top surface 401 of the slope material layer 201 is A, the length of a projection image on the top surface 402 of the OLED substrate 202 is A multiplied by cos β, and thus in a same area, a number of image pixels presented on the top surface 402 of the OLED substrate 202 is greater than a number of image pixels presented on the top surface 401 of the slope material layer 201. That is, a pixel resolution at the top surface 402 of the OLED substrate 202 is greater than a pixel resolution at the top surface 401 of the slope material layer 201.

Figure 5:
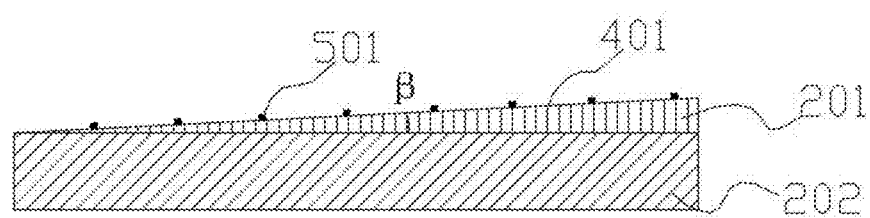
FIG. 5 is a cross sectional view of an OLED substrate according to an embodiment of the present disclosure.

Refer to FIG. 5, a cross sectional view of the OLED substrate 202 and the slope material layer 201 according to an embodiment of the present disclosure is provided. Because a surface area of the top surface 401 of the slope material layer 201 is greater than a surface area of the top surface 402 of the OLED substrate 202, thus more thin film transistors (TFTs), capacitors, wires, etc. of optical components or electronic components 501 can be disposed on the top surface 401 of the slope material layer 201. After being projected, the images presented by the optical components or the electronic devices on the top surface 401 of the slope material layer 201 can be completely projected on the top surface 402 of the OLED substrate 202, resolution of the display and display performance can be improved.

In a specific implementation, the OLED substrate may be a touch substrate or a display substrate. Based on same inventive concept, an OLED substrate provided by an embodiment of the present disclosure can be applied to any product or component having a display function such as a virtual reality (VR) display device, a mobile phone, a computer, a television, a display, or the like.

It can be understood from the above embodiments that the method of manufacturing the OLEO substrate and the OLEO substrate can cover the OLEO substrate with the slope material layer on basis of currently manufacturing equipment and manufacturing processes. The slope material layer is processed to form the slope structure on the top surface of the OLEO substrate, and a top surface area of a newly formed slope structure is greater than a top surface area of an original OLEO substrate, such that more thin film transistors, capacitors, and wires of electronic devices can be disposed on the slope material layer. After being projected through the display, a pixel resolution of a display screen is improved, and the manufacturing cost of a high pixel resolution screen is also reduced.

The method of manufacturing the OLED substrate and the OLED substrate provided by the embodiments of the present disclosure are described in detail. The specific examples are used herein to explain principles and implementation manners of the disclosure. The description of the above embodiments is only for understanding technical solutions and core ideas of the present disclosure. It should be noted that those of ordinary skill in the art can make a variety of improvements and substitutions on the premise of not deviating from the technical principle of the present disclosure, and these improvements and substitutions should be encompassed within the protection scope of the present disclosure.

The invention claimed is:

1. An organic light emitting diode (OLED) substrate, comprising:

a slope material layer covering a top surface of the OLED substrate;

wherein the slope material layer comprises a slope structure on the OLED substrate, and a top surface of the slope material layer is provided with optical components or electronic components capable of presenting images;

wherein the optical components or the electronic components of the top surface of the slope material layer comprise thin film transistors, capacitors, and wires.

2. The OLED substrate according to claim 1, wherein the images presented by the optical components or the electronic components disposed on the top surface of the slope material layer are all projected within the top surface of the OLED substrate.

3. The OLED substrate according to claim 1, wherein the slope material layer is a molecular structure having a main chain of C—C or C—Si material.

4. The OLED substrate according to claim 1, wherein the OLED substrate is a touch substrate.

5. The OLED substrate according to claim 1, wherein the OLED substrate is a display substrate.

* * * * *